(12) United States Patent
Ji (10) Patent No.: US 12,438,109 B2
(45) Date of Patent: *Oct. 7, 2025

(54) SEMICONDUCTOR PACKAGE AND MANUFACTURING METHOD THEREOF

(71) Applicant: MEDIATEK Inc., Hsinchu (TW)

(72) Inventor: Yan-Liang Ji, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/601,003

(22) Filed: Mar. 11, 2024

(65) Prior Publication Data

US 2024/0213194 A1    Jun. 27, 2024

Related U.S. Application Data

(63) Continuation of application No. 17/580,699, filed on Jan. 21, 2022, now Pat. No. 11,935,852.

(Continued)

(51) Int. Cl.
*H01L 23/00* (2006.01)

(52) U.S. Cl.
CPC .............. *H01L 24/05* (2013.01); *H01L 24/03* (2013.01); *H01L 24/13* (2013.01);
(Continued)

(58) Field of Classification Search
CPC ......... H01L 24/05; H01L 24/03; H01L 24/13; H01L 2224/0401; H01L 2224/05094; H01L 2224/13026; H01L 23/49816; H01L 23/49827; H01L 23/49894; H01L 23/49822; H01L 23/498; H01L 21/56; H01L 23/31
See application file for complete search history.

(56) References Cited

U.S. PATENT DOCUMENTS 11,935,852 B2 *   3/2024   Ji ....................... H01L 23/49822
2011/0198748 A1   8/2011   Koike
(Continued)

FOREIGN PATENT DOCUMENTS

WO    2004027865 A2    4/2004
WO    2017171772 A1    10/2017

OTHER PUBLICATIONS

TW Office Action dated Aug. 15, 2022 in Taiwan application No. 111107732.

(Continued)

*Primary Examiner* — Douglas W Owens
(74) *Attorney, Agent, or Firm* — McClure, Qualey & Rodack, LLP (57) ABSTRACT

A semiconductor package includes a substrate, a first insulation layer, a conductive pad, a second insulation layer and a conductive trace. The first insulation layer is formed on the substrate and having a first through hole. The conductive pad is formed on the substrate through the first through hole. The second insulation layer has a first surface and a second through hole, wherein the second through hole extends to the conductive pad from the first surface. The conductive trace has a second surface and is connected to the conductive pad through the second through hole. The entire of the first surface is in the same level, and the entire of the second surface is in the same level.

18 Claims, 7 Drawing Sheets

Related U.S. Application Data (60) Provisional application No. 63/172,127, filed on Apr. 8, 2021.

(52) U.S. Cl.
CPC ................. *H01L 2224/0401* (2013.01); *H01L 2224/05094* (2013.01); *H01L 2224/13026* (2013.01)

(56) References Cited

U.S. PATENT DOCUMENTS

| | | | |
|---|---|---|---|
| 2013/0020697 A1 | 1/2013 | Deschenes et al. | |
| 2015/0162256 A1* | 6/2015 | Hsu .................. | H01L 23/481 |
| | | | 257/774 |
| 2017/0162540 A1* | 6/2017 | Ji ............................ | H01L 24/13 |
| 2017/0263523 A1* | 9/2017 | Ji ............................ | H01L 24/08 |
| 2019/0393160 A1* | 12/2019 | Wang .................. | H01L 23/5225 |
| 2020/0105635 A1 | 4/2020 | Yu | |
| 2020/0126935 A1* | 4/2020 | Wu ........................ | H01L 24/13 |
| 2020/0411461 A1 | 12/2020 | Lee | |

OTHER PUBLICATIONS

EP Search Reported dated Sep. 12, 2022 in European application No. 22161602.2-1211.

\* cited by examiner

SEMICONDUCTOR PACKAGE AND MANUFACTURING METHOD THEREOF

This application is a continuation application of co-pending application Ser. No. 17/580,699, filed on Jan. 21, 2022 (now U.S. Pat. No. 11,935,852), which claims the benefit of US Provisional application Ser. No. 63/172,127, filed on Apr. 8, 2021, the contents of which are incorporated herein by reference.

FIELD OF THE INVENTION

The invention relates to a semiconductor package and a manufacturing method thereof, and more particularly to a semiconductor package and a manufacturing method thereof including a conductive via.

BACKGROUND OF THE INVENTION

Conventional semiconductor package includes a conductive via, conductive trace and a substrate including a conductive component, wherein the conductive via electrically connects the conductive trace and the conductive component. The conductive trace generally conforms to shape of a through hole below the conductive trace to form a recess. However, such recess results reduced strength or incomplete structure. Thus, how to make the conductive trace have complete structure has become a prominent task for the industries.

Thus, how to connect with the semiconductor devices for increasing transmission speed has become a prominent task for the industries.

SUMMARY OF THE INVENTION

In an embodiment of the invention, a semiconductor package is provided. The semiconductor package includes a substrate, a first insulation layer, a conductive pad, a second insulation layer and a conductive trace. The first insulation layer is formed on the substrate and having a first through hole. The conductive pad is formed on the substrate through the first through hole. The second insulation layer has a first surface and a second through hole, wherein the second through hole extends to the conductive pad from the first surface. The conductive trace has a second surface and is connected to the conductive pad through the second through hole. The entire of the first surface is in the same level, the entire of the second surface is in the same level and the second insulation layer comprises a plurality of layers, one of the layers has a third surface, and the third surface is in the same level.

In another embodiment of the invention, a semiconductor package is provided. The manufacturing method includes the following steps: providing a substrate; forming a first insulation layer on the substrate, wherein the first insulation layer has a first through hole; forming a conductive pad on the substrate through the first through hole; forming a second insulation layer having a first surface and a second through hole, wherein the second through hole extends to the conductive pad from the first surface, wherein the entire of the first surface is in the same level; and forming a conductive trace having a second surface and connected to the conductive pad through the second through hole, wherein the entire of the second surface is in the same level. In step of forming the second insulation layer, the second insulation layer comprises a plurality of layers, one of the layers has a third surface, and the third surface is in the same level.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
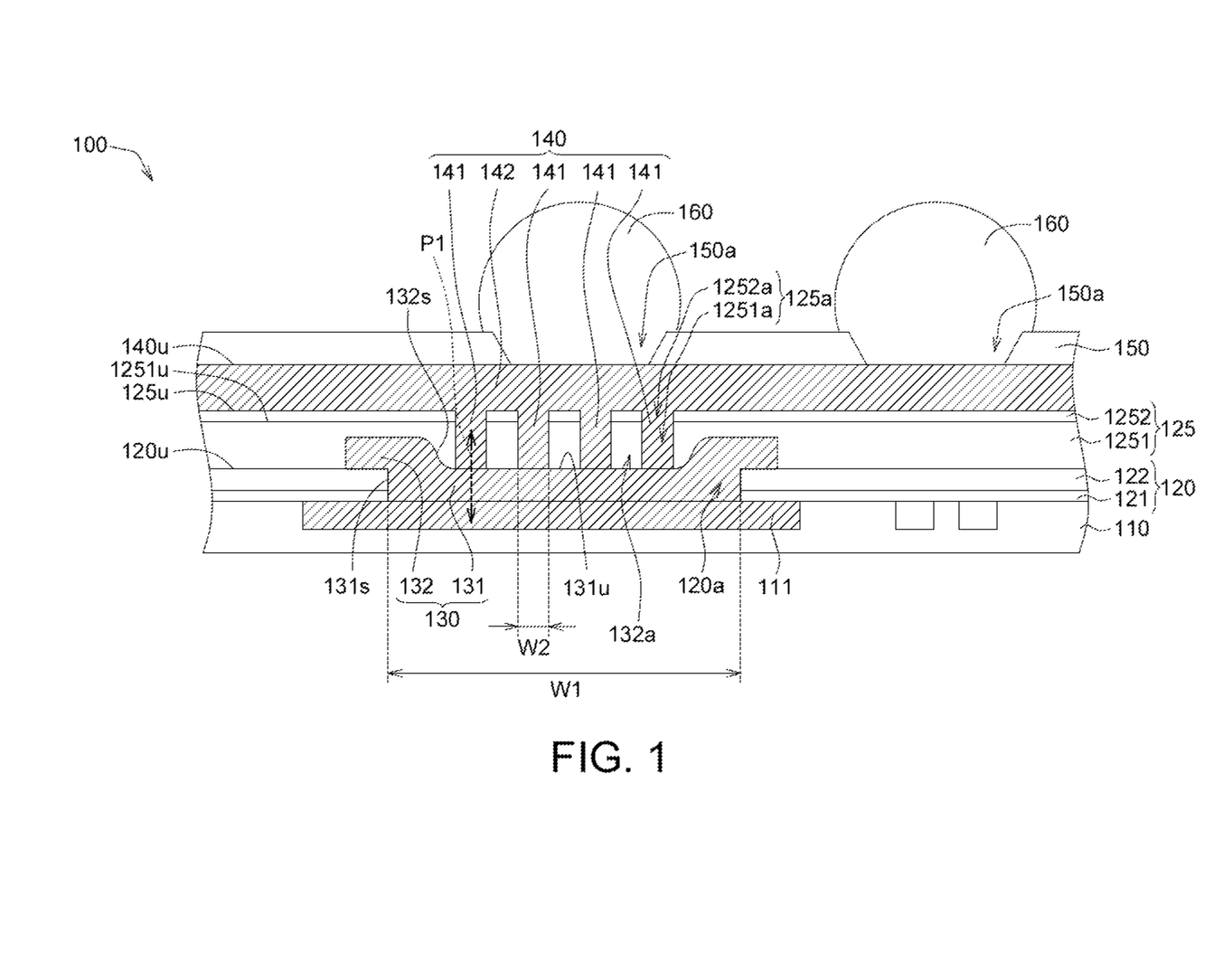
FIG. 1 illustrates a diagram view of a semiconductor package according to an embodiment of the invention.

Referring to FIG. 1, FIG. 1 illustrates a diagram view of a semiconductor package 100 according to an embodiment of the invention. The semiconductor package 100 includes a substrate 110, a first insulation layer 120, a second insulation layer 125, at least one conductive pad 130, at least one conductive trace 140, an encapsulation 150 and at least one contact 160. The semiconductor package 100 is, for example, Wafer Level Chip Scale Packaging (WLCSP).

The first insulation layer 120 is formed on the substrate 110 and has at least one first through hole 120a. The conductive pad 130 is formed on the substrate 110 through the first through hole 120a. The second insulation layer 125 has a first surface 125u and at least one second through hole 125a, wherein the second through hole 125a extends to the conductive pad 130 from the first surface 125u. The conductive trace 140 has a second surface 140u and is connected to the conductive pad 130 through the second through hole 125a. The entire of the first surface 125u is in the same level, and the entire of the second surface 140u is in the same level. In other words, the first surface 125u has no step surface (structure), and the second surface 140u has no step surface (structure). In the present embodiment, the entire of the second surface 140u is in the same level, it means that the conductive trace 140 has no concave recessed relative to the second surface 140u of the conductive trace 140, and thus it could have stronger or sufficient strength.

As shown in FIG. 1, the first surface 125u is, for example, flat surface, and the second surface 140u is, for example, flat surface.

As shown in FIG. 1, the substrate 110 is, for example, wafer. The conductive component 111 of the substrate 110 could include, for example, at least one metal layer, at least one conductive trace, at least one conductive via and/or at least one transistor electrically connected to the metal layer, the conductive trace and/or the conductive via.

As shown in FIG. 1, the first insulation layer 120 includes a first layer 121 and a second layer 122. The first layer 121 is formed on the substrate 110, and the second layer 122 is formed on the first layer 121. The first through hole 120a passes through the first layer 121 and the second layer 122. In addition, the first layer 121 is made of a material including, for example, silicon nitride (SiN), and the second layer 122 is made of a material including, for example, oxide. In addition, the first through hole 120a has a width W1 greater than 5 micrometer (μm), or ranging between 5 μm and 300 μm, or even greater than 300 μm, wherein the width W1 is, for example, the dimension in width or diameter. Viewing from a top direction, the first through hole 120a could be circle, polygon, ellipse, etc.

As shown in FIG. 1, the second insulation layer 125 cover the first insulation layer 120 and a portion of the conductive pad 130. The second insulation layer 125 includes a third layer 1251 and a fourth layer 1252. The third layer 1251 cover the first insulation layer 120 and a portion of the conductive pad 130, and the fourth layer 1252 is formed on the third layer 1251. The second through hole 125a passes through the third layer 1251 and the fourth layer 125 to expose a portion of the conductive pad 130. Furthermore, the third layer 1251 has at least one first hole 1251a, the fourth layer 1252 has at least one second hole 1252a, wherein the first hole 1251a and the second hole 1252a form the second through hole 125a to expose the conductive pad 130. The first hole 1251a and the second hole 1252a could be formed in the same manufacturing process, for example, etching. In the present embodiment, a number of the second through holes 125a extend to the same (or one) conductive pad 130 from the first surface 125u. In addition, the third layer 1251 could be made of a material including, for example, oxide, and the fourth layer 1252 could be made of a material including, for example, silicon nitride (SiN).

As shown in FIG. 1, the second through hole 125a has a width W2. The width W2 ranges between 2 μm and 12 μm, even less than 2 μm or greater than 12μm, wherein the width W2 is, for example, the dimension in width or diameter. The width W2 is small enough, and accordingly it could prevent the extending portion 142 above the connecting portion 141 from forming/generating recess, cavity, concave and/or crack. As a result, the conductive trace 140 has sufficient strength. In addition, viewing from a top direction, the second through hole 125a could be circle, polygon, ellipse, etc.

As shown in FIG. 1, the first surface 125u is an upper surface of the fourth layer 1252, and the third layer 1251 has a third surface 1251u, wherein the third surface 1251u is in the same level. In another embodiment, the third surface 1251u is, for example, a grinding surface by a process, for example, CMP (Chemical-Mechanical Planarization).

As shown in FIG. 1, each conductive pad 130 includes a conductive via 131 and a protrusion layer 132. The conductive via 131 is directly formed on the conductive component 111 of the substrate 110 through the first through hole 120a. In other words, there is no physical material between the conductive component 111 and the conductive via 131. In addition, at least one portion of the conductive via 131 could be formed within the first through hole 120a. The conductive via 131 has an upper surface 131u which could protrude relative to an upper surface 120u of the first insulation layer 120. In another embodiment, the upper surface 131u could be recessed relative to an upper surface 120u of the first insulation layer 120, or flush with the upper surface 120u of the first insulation layer 120.

As shown in FIG. 1, the conductive via 131 fills up the first through hole 120a and could receive or carry a plurality of the connecting portions 141, for example, four connecting portions 141. The conductive via 131 has the width W1 formed within the first through hole 120a. In addition, viewing from a top direction, the conductive via 131 could be circle, polygon, ellipse, etc.

As shown in FIG. 1, the protrusion layer 132 connects with the conductive via 131, protrudes relative to the upper surface 131u of the conductive via 131 and extends beyond a lateral surface 131s of the conductive via 131.

In an embodiment, the conductive via 131 and the protrusion layer 132 could be formed in the same manufacture process, for example, sputtering. As a result, the conductive via 131 and the protrusion layer 132 could form an integral structure. In addition, due to sputtering, the protrusion layer 132 has a curved lateral surface 132s connected to the upper surface 131u of the conductive via 131. In addition, the protrusion layer 132 has an opening 132a exposing the conductive via 131, wherein the conductive trace 140 is connected to the conductive via 131 through the opening 132a. In terms of material, the conductive via 131 and the protrusion layer 132 could be made of a material including, for example, aluminum, copper or combination thereof. In addition, viewing from a top direction, the protrusion layer 132 could be a closed-ring or opened-ring exposing the upper surface 131u of the conductive via 131.

As shown in FIG. 1, at least one conductive trace 140 is, for example, at least one of a portion of Redistribution Layer (RDL). The conductive trace 140 includes at least one connecting portion 141 and an extending portion 142 connected to the at least one connecting portion 141, wherein each connecting portion 141 fills up the corresponding second through hole 125a to be connected with the conductive via 131. The conductive trace 140 and the conductive via 131 overlap up and down. Furthermore, the whole of the connecting portion 141, a portion of the extending portion 142 and the conductive via 131 overlap up and down. In addition, the first through hole 120a, the connecting portion 141 and the conductive via 131 overlap up and down. In terms of material, the conductive trace 140 could be made of a material including, for example, aluminum, copper or combination thereof.

As shown in FIG. 1, the connecting portion 141 filling up the second through hole 125a has the width W2. The width W2 of the connecting portion 141 is less than the width W1 of the conductive via 131 formed within the first through hole 120a.

As shown in FIG. 1, the conductive trace 140 is directly connected to the conductive pad 130 which is located right above the first through hole 120a. For example, the connecting portion 141 of the conductive trace 140 is located right above the first through hole 120a. As a result, a conductive path P1 among the conductive component 111, the conductive trace 140 and the conductive via 130 is shorter or the shortest (for example, in vertical distance), and thus it could reduce parasitic resistance.

As shown in FIG. 1, there is no physical layer between the conductive trace 140 and the second insulation layer 125. For example, there is no molding compound between the conductive trace 140 and the second insulation layer 125. In other words, in the present embodiment, there is no molding compound covering the conductive pad 130 and the second insulation layer 125. The molding compound includes, for example, Polybenzoxazole (PBO). Compared to the second through hole 125a formed on the molding compound, the second through hole 125a formed on the second insulation layer 125 in the present embodiment has the width W2 which could be small.

The encapsulation 150 covers the conductive trace 140 and/or and the conductive trace 140. The encapsulation 150 has at least one an opening 150a exposing the extending portion 142 of the conductive trace 140. The encapsulation 150 could be made of a material including, for example, PBO (Polybenzoxazole) or molding compound material. Each contact 160 is physically connected or electrically connected to the conductive trace 140 through the corresponding opening 150a. In an embodiment, the contact 160 is, for example, solder ball, conductive pillar, etc.

Figure 2:
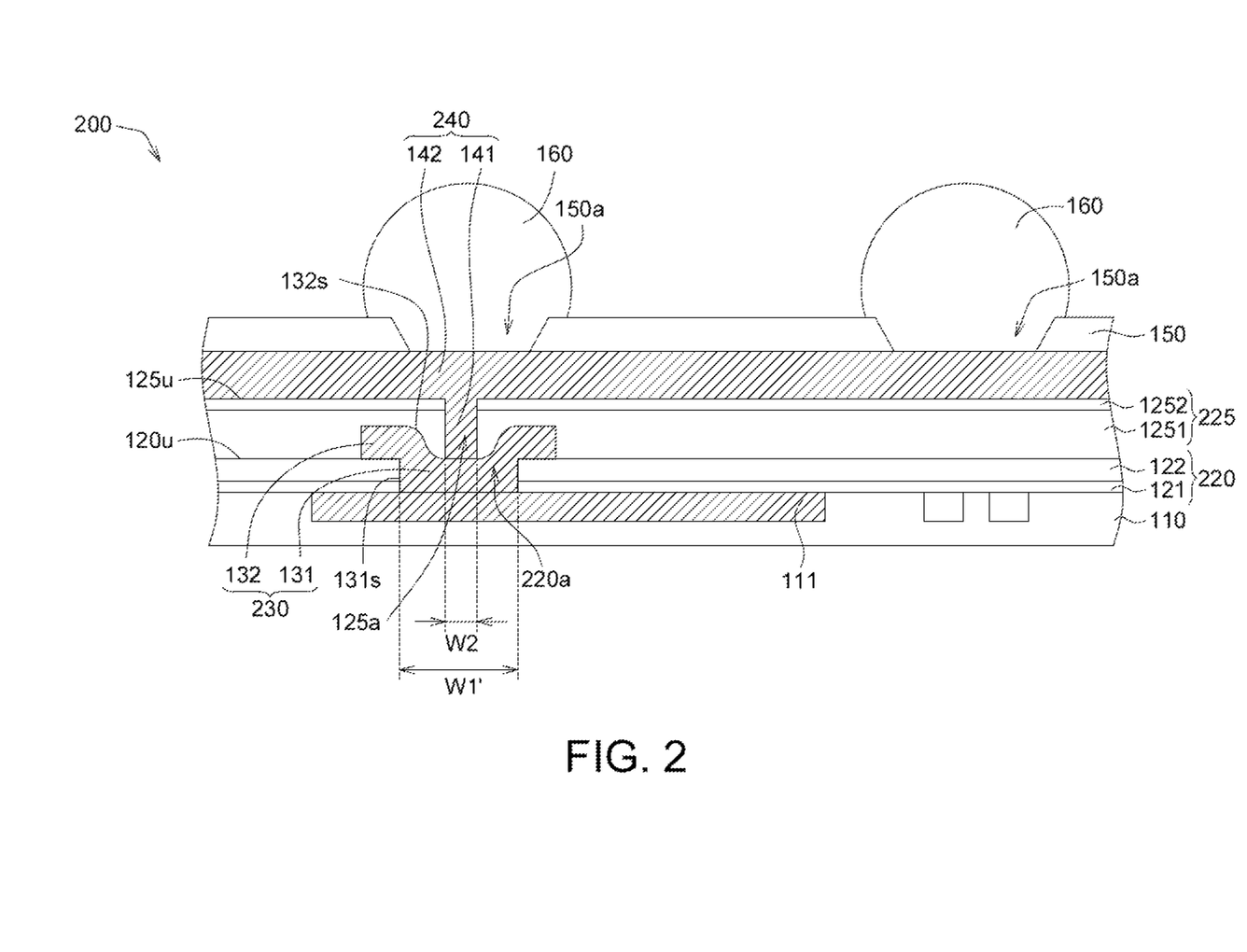
FIG. 2 illustrates a diagram view of a semiconductor package according to another embodiment of the invention.

Referring to FIG. 2, FIG. 2 illustrates a diagram view of a semiconductor package 200 according to another embodiment of the invention. The semiconductor package 200 includes the substrate 110, the first insulation layer 220, the second insulation layer 225, at least one conductive pad 230, at least one conductive trace 240, the encapsulation 150 and at least one contact 160.

The semiconductor package 200 includes the features similar to or the same as that of the semiconductor package 100 expect that the conductive pad 230 of the semiconductor package 200 receive or carry one connecting portion 141, that is, one connecting portion 141 is connects to one conductive pad 230.

As shown in FIG. 2, in the present embodiment, the first insulation layer 220 has at least one first through hole 220a. The first through hole 220a has a width W1' smaller that the width W2 of the first through hole 220a. In the present embodiment, the width W1' of the first through hole 220a is smaller than the width W1 of the first through hole 120a of the semiconductor package 100. The width W1' of the first through hole 220a is greater than 5 μm, or ranges between 5 μm and 300 μm, or even is greater than 300 μm, and the conductive via 131 within the first through hole 220a could receive or carry one connecting portions 141.

As shown in FIG. 2, the second insulation layer 225 has at least one second through hole 125a extending to the conductive pad 230 from the first surface 125u of the second insulation layer 225. The connecting portion 141 fills up the corresponding second through hole 125a to connect with the conductive via 131 of the conductive pad 230.

Figure 3:
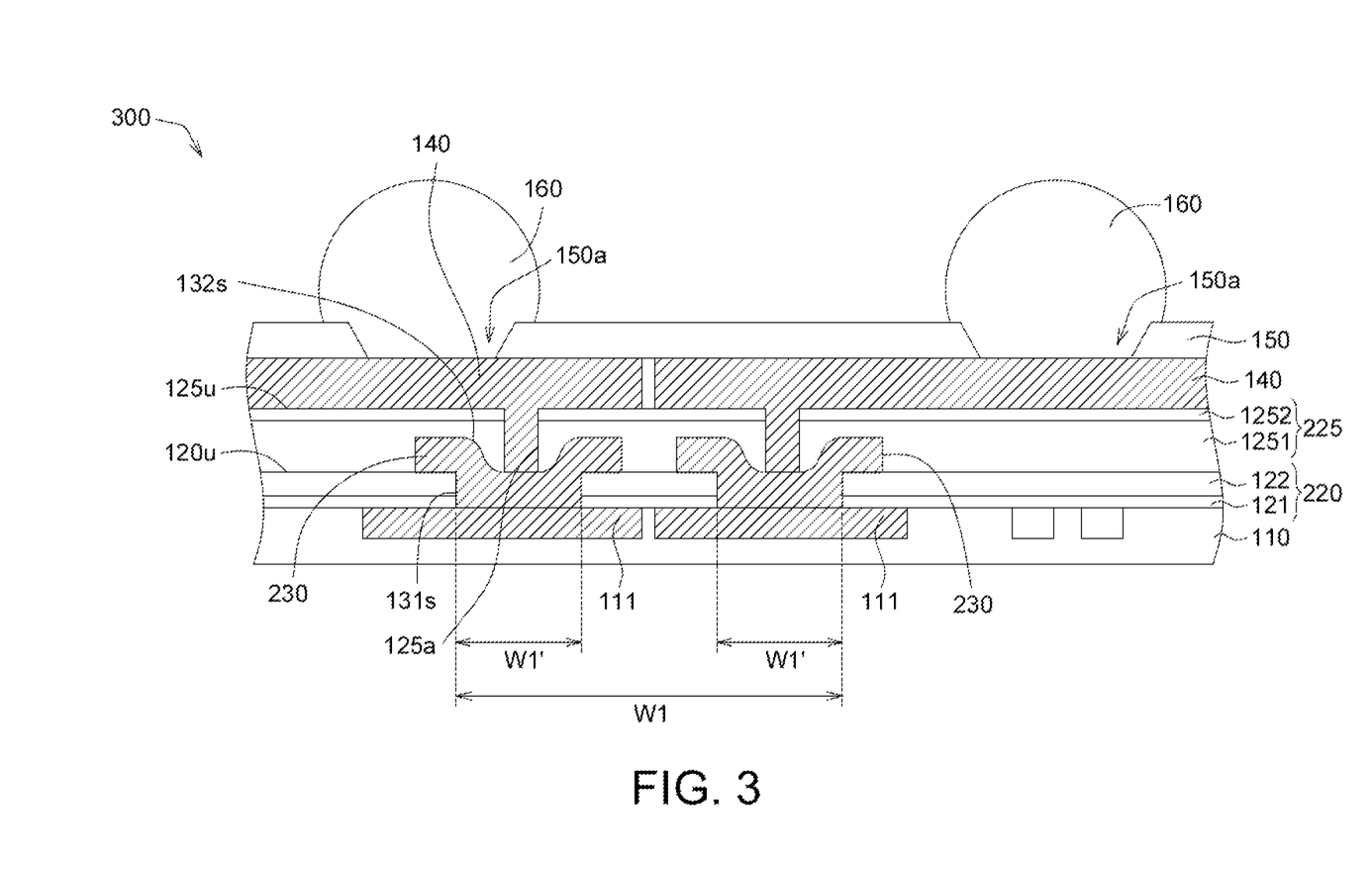
FIG. 3 illustrates a diagram view of a semiconductor package according to another embodiment of the invention.

Referring to FIG. 3, FIG. 3 illustrates a diagram view of a semiconductor package 300 according to another embodiment of the invention. The semiconductor package 300 includes the substrate 110, the first insulation layer 220, the second insulation layer 225, at least one conductive pad 230, at least one conductive trace 240, the encapsulation 150 and at least one contact 160.

The semiconductor package 300 includes the features similar to or the same as that of the semiconductor package 200 expect that a number of the conductive pads 230 of the semiconductor package 300 are disposed adjacently. In addition, as shown in FIG. 3, the substrate 110 includes a plurality of the conductive component 111 which are electrically connected with a plurality of the conductive traces 240.

Furthermore, as shown in FIG. 3, in the same width W1, a number of the conductive pads 230 are disposed adjacently in the semiconductor package 300 while just one conductive pad 230 is disposed in the semiconductor package 200 as shown in FIG. 1. In other words, the semiconductor package 300 could provide more I/O ports and/or voltage levels in the same width W1.

FIGS. 4A to 4F illustrate manufacturing processes of the semiconductor package 100 of FIG. 1.

Figure 4A:
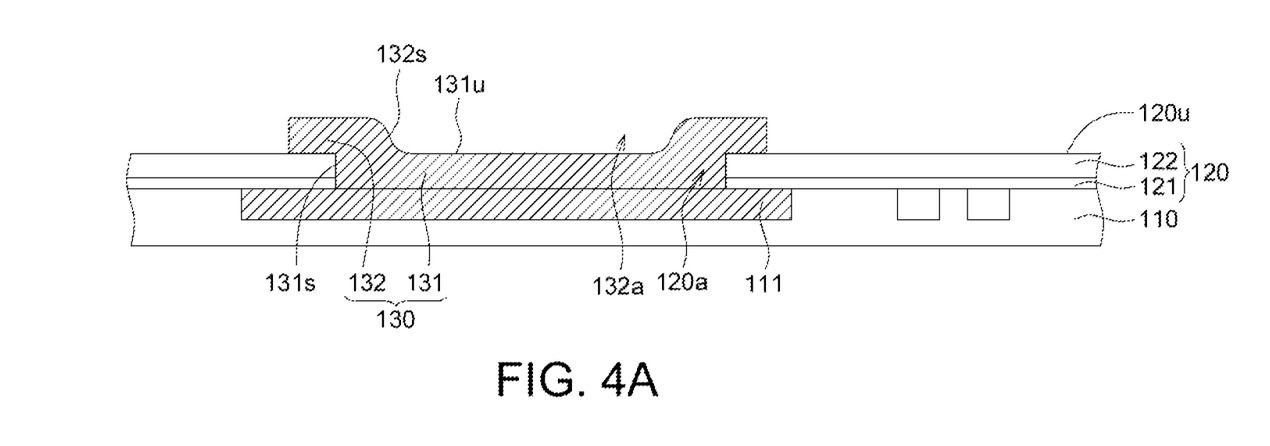
FIGS. 4A to 4F illustrate manufacturing processes of the semiconductor package of FIG. 1.

As illustrated in FIG. 4A, the substrate 110 is provided, wherein the substrate 110 is, for example, wafer, and the substrate 110 includes at least one conductive component 111, at least one metal layer (not illustrated), at least one conductive trace (not illustrated), at least one conductive via (not illustrated) and/or at least one transistor (not illustrated) electrically connected to the metal layer, the conductive trace and/or the conductive via.

As illustrated in FIG. 4A, the first insulation layer 120 including the first layer 121 and the second layer 122 is formed on substrate 110 by using, for example, coating, applying, etc. The first insulation layer 120 has at least one first through hole 120a exposing the corresponding conductive component 111. The first through hole 120a is formed by using, for example, etching.

As illustrated in FIG. 4A, at least one conductive via 131 and at least one protrusion layer 132 are formed within the corresponding first through hole 120a. At least one protrusion layer 132 and at least one conductive via 131 form at least one conductive pad 130. In the present embodiment, the conductive via 131 and the protrusion layer 132 could be formed in the same manufacture process, for example, sputtering, and thus the conductive via 131 and the protrusion layer 132 could form an integral structure. Due to sputtering, the protrusion layer 132 forms the curved lateral surface 132s connected to the upper surface 131u of the conductive via 131. In addition, the protrusion layer 132 has the opening 132a exposing the conductive via 131, and the conductive trace 140 is connected to the conductive via 131 through the opening 132a. In terms of material, the conductive via 131 and the protrusion layer 132 could be made of a material including, for example, aluminum, copper or combination thereof. In addition, viewing from a top direction, the protrusion layer 132 could be a closed-ring or opened-ring exposing the upper surface 131u of the conductive via 131. The protrusion layer 132 connects with the conductive via 131, protrudes relative to the upper surface 131u of the conductive via 131 and extends beyond the lateral surface 131s of the conductive via 131.

Figure 4B:
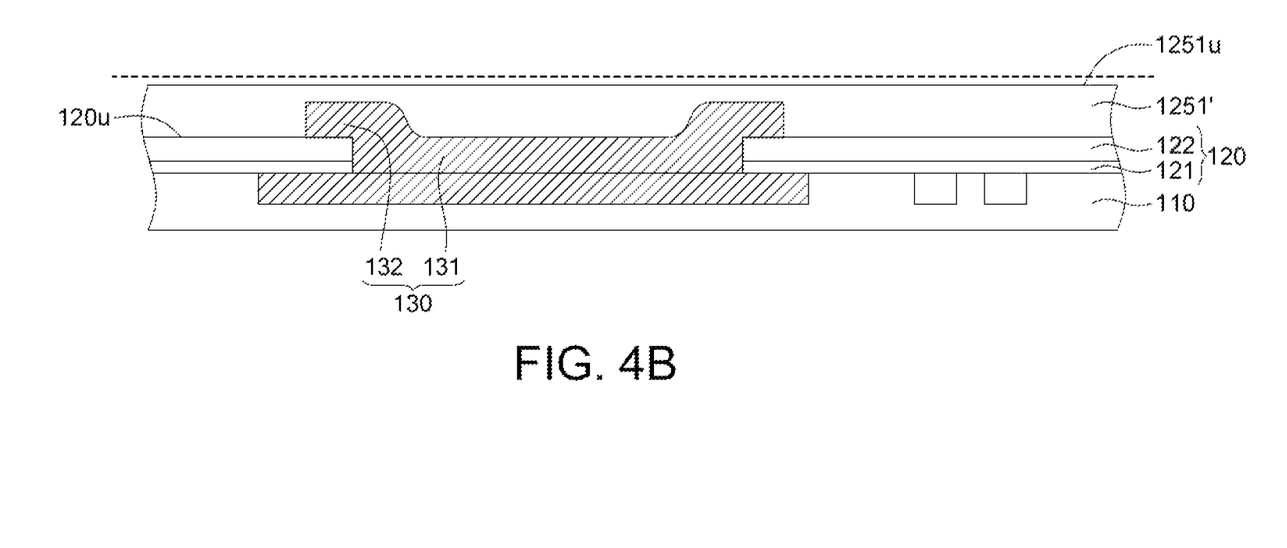

As illustrated in FIG. 4B, a third layer material 1251' covering the conductive pad 130 and the first insulation layer 120 is formed by using, for example, coating, applying, etc.

As illustrated in FIG. 4B, the third layer material 1251' is planarized to form the third surface 1251u of the third layer material 1251' is formed by using, for example, CMP. The third surface 1251u is flat surface, for example. In addition, the third layer material 1251' could be made of a material including, for example, oxide.

Figure 4C:
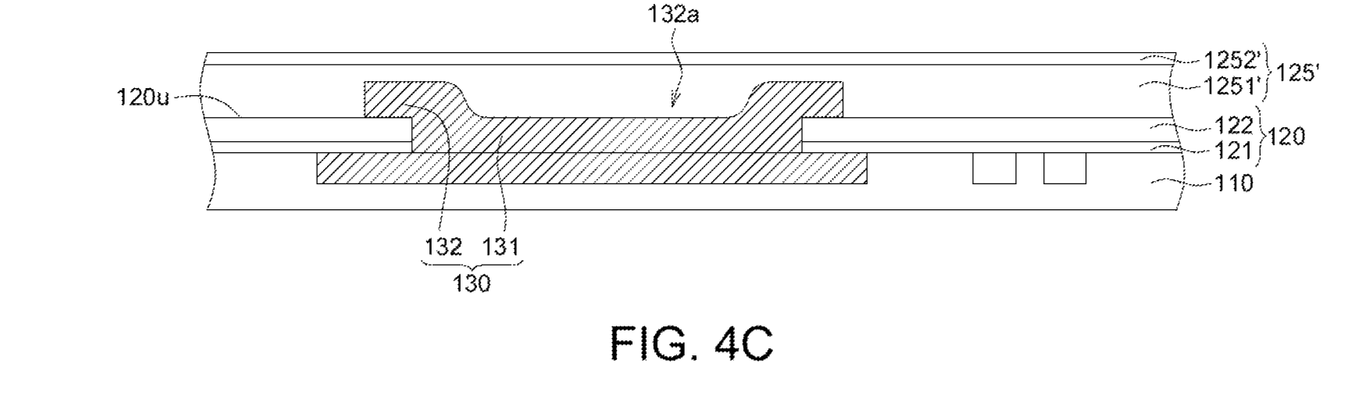

As illustrated in FIG. 4C, the fourth layer material 1252' covering the third layer material 1251' is formed by using, for example, coating, applying, etc. The fourth layer material 1252' and the third layer material 1251' form the second insulation layer material 125'. In addition, the fourth layer material 1252' could be made of a material including, for example, silicon nitride (SiN).

Figure 4D:
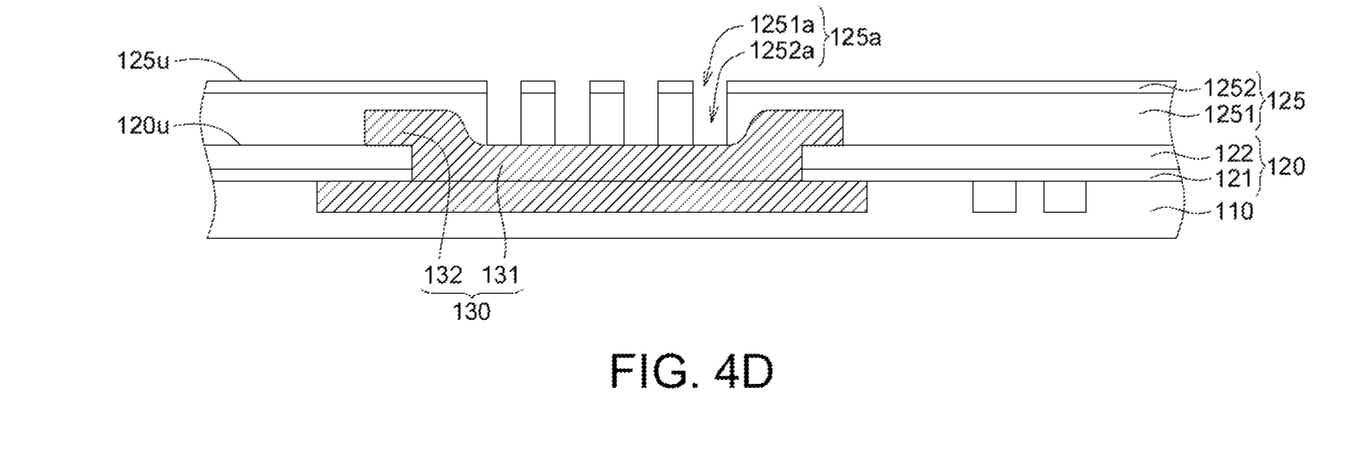

As illustrated in FIG. 4D, at least one second through hole 125a passing through the third layer material 1251' and the fourth layer material 1252' to form the second insulation layer 125 and expose a portion of the conductive pad 130. Furthermore, the third layer 1251 has at least one first hole 1251a, the fourth layer 1252 has at least one second hole 1252a, wherein the first hole 1251a and the second hole 1252a form the second through hole 125a. The first hole 1251a and the second hole 1252a could be formed in the same manufacturing process, for example, etching. In the present embodiment, a number of the second through holes 125a extend to the same (or one) conductive pad 130 from the first surface 125u.

Figure 4E:
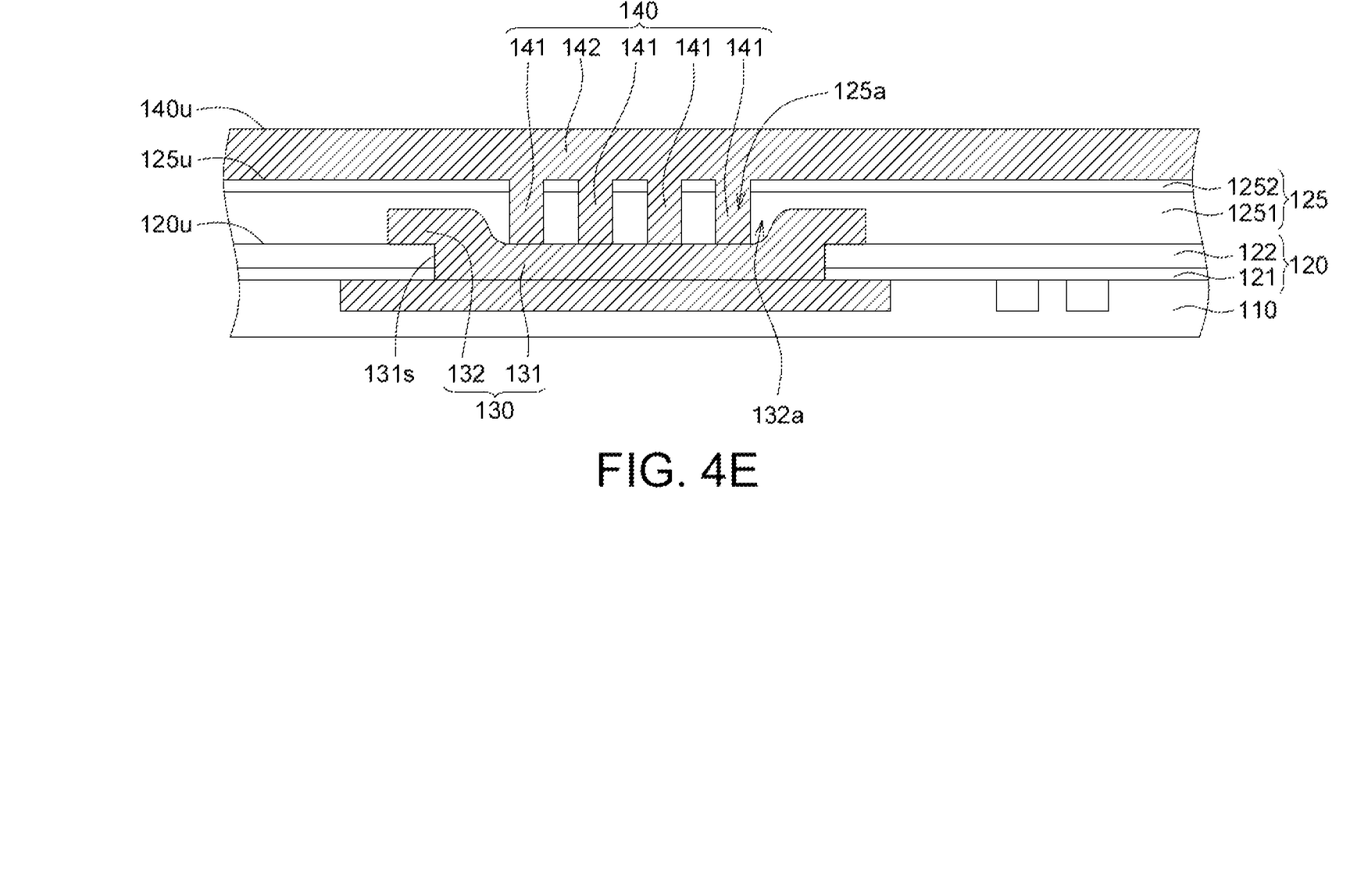

As illustrated in FIG. 4E, at least one conductive trace 140 covering the second insulation layer 125 is formed on the encapsulation 150 by using, for example, sputtering, plating, etc. The conductive trace 140 includes at least one connecting portion 141 and an extending portion 142 connected to the at least one connecting portion 141, wherein each connecting portion 141 fills up the corresponding second through hole 125a to be connected with the conductive via 131. The conductive trace 140 and the conductive via 131 overlap up and down. Furthermore, the whole of the connecting portions 141, a portion of the extending portion 142 and the conductive via 131 overlap up and down. In addition, the first through hole 120a, the connecting portions 141 and the conductive via 131 overlap up and down. In terms of material, the conductive trace 140 could be made of a material including, for example, aluminum, copper or combination thereof.

Figure 4F:
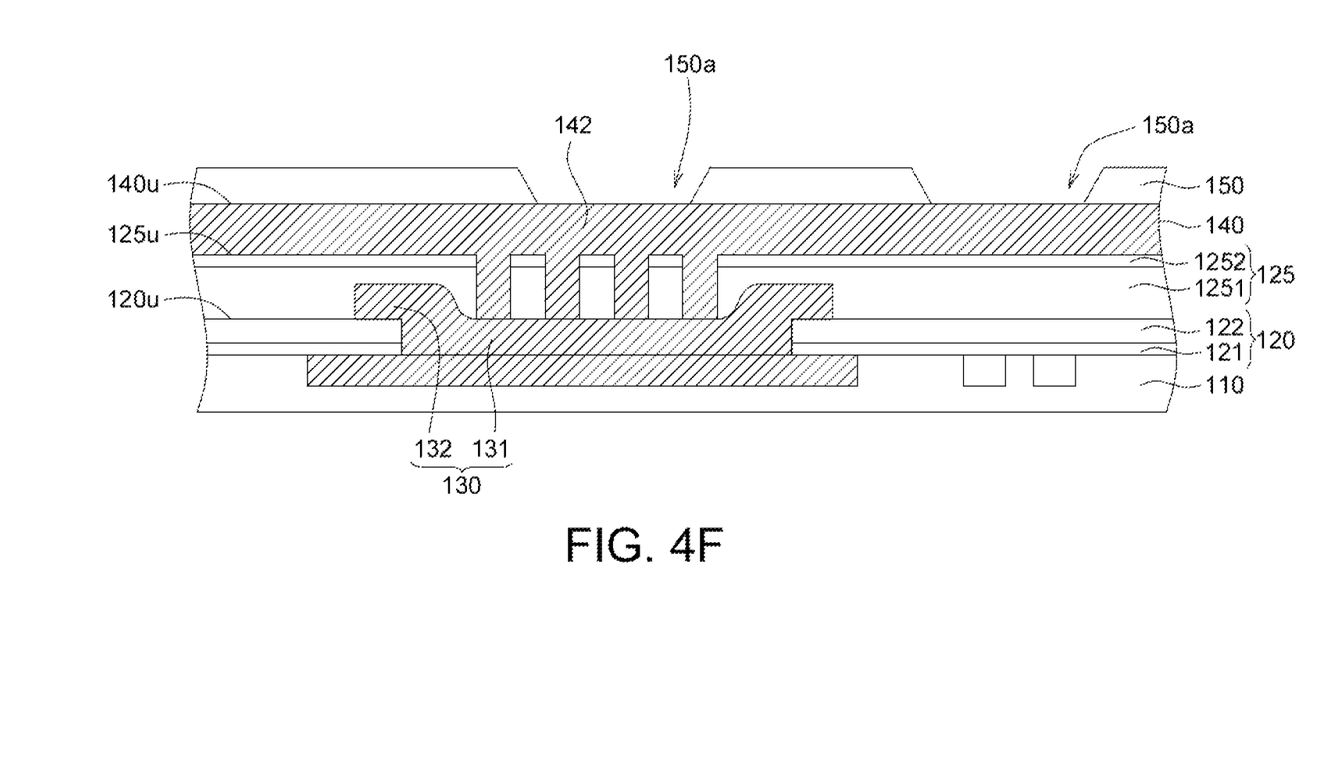

As illustrated in FIG. 4F, the encapsulation 150 covering the conductive trace 140 is formed by using, for example, coating, applying, etc. The encapsulation 150 has at least one an opening 150a exposing the extending portion 142 of the conductive trace 140. The encapsulation 150 could be made of a material including, for example, PBO (Polybenzoxazole) or molding compound material.

Then, at least one contact 160 physically connected or electrically connected to the conductive trace 140 is formed through the corresponding opening 150a, as shown in FIG. 1. In an embodiment, the contact 160 is, for example, solder ball, conductive pillar, etc.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprising:
   a substrate;
   a first insulation layer formed on the substrate and having a first through hole;
   a conductive pad formed on the substrate through the first through hole;
   a second insulation layer having a first surface and a second through hole, wherein the second through hole extends to the conductive pad from the first surface; and
   a conductive trace having a second surface and connected to the conductive pad through the second through hole;
   wherein an entirety of the first surface is in the same level, the entirety of the second surface is in the same level, and the second insulation layer comprises a plurality of layers, one of the layers has a third surface, and the third surface is in the same level.

2. The semiconductor package as claimed in claim 1, wherein the second insulation layer has a plurality of the second through hole extending to the same conductive pad from the first surface.

3. The semiconductor package as claimed in claim 1, wherein there is no physical layer between the conductive trace and the second insulation layer.

4. The semiconductor package as claimed in claim 1, wherein there is no molding compound covering the conductive pad and the second insulation layer.

5. The semiconductor package as claimed in claim 1, wherein the first through hole has a width greater than 5 μm.

6. The semiconductor package as claimed in claim 1, wherein the second through hole has a width ranging between 2 μm and 12 μm.

7. The semiconductor package as claimed in claim 1, wherein the conductive trace is directly connected to the conductive pad which is located right above the first through hole.

8. The semiconductor package as claimed in claim 1, wherein the conductive trace comprises a connecting portion and an extending portion connected to the connecting portion, the connecting portion is directly connected to the conductive pad, and the connecting portion and the conductive pad overlap up and down.

9. The semiconductor package as claimed in claim 8, wherein the conductive pad comprises:
   a conductive via formed in the first through hole; and
   a protrusion layer connecting with the conductive via, protruding relative to an upper surface of the conductive via and extending beyond a lateral surface of the conductive via;
   wherein the conductive trace is directly connected to the conductive via.

10. A manufacturing method, comprising:
    providing a substrate;
    forming a first insulation layer on the substrate, wherein the first insulation layer has a first through hole;
    forming a conductive pad on the substrate through the first through hole;
    forming a second insulation layer having a first surface and a second through hole, wherein the second through hole extends to the conductive pad from the first surface, wherein an entirety of the first surface is in the same level; and
    forming a conductive trace having a second surface and connected to the conductive pad through the second through hole, wherein the entirety of the second surface is in the same level;
    wherein in step of forming the second insulation layer, the second insulation layer comprises a plurality of layers, one of the layers has a third surface, and the third surface is in the same level.

11. The manufacturing method as claimed in claim 10, wherein step of forming the second insulation layer comprises:
    forming a third layer covering the conductive pad and the first insulation layer; and
    planarizing the third layer to form the third surface of the third layer, wherein the third surface is flat surface.

12. The manufacturing method as claimed in claim 11, wherein after step of planarizing the layer, the manufacturing method further comprises:
    forming a fourth layer to cover the third layer; and
    forming the second through hole to pass through the fourth layer and the fourth layer to expose a portion of the conductive pad.

13. The manufacturing method as claimed in claim 10, wherein in step of forming the conductive trace, there is no physical layer between the conductive trace and the second insulation layer.

14. The manufacturing method as claimed in claim 10, wherein in step of forming the second insulation layer, there is no molding compound covering the conductive pad and the second insulation layer.

15. The manufacturing method as claimed in claim 10, wherein in step of forming the first insulation layer, the first through hole has a width greater than 5 μm.

16. The manufacturing method as claimed in claim 10, wherein in step of forming the second insulation layer, the second through hole has a width ranges between 2 μm and 12 μm.

17. The manufacturing method as claimed in claim 10, wherein in step of forming the conductive trace, the conductive trace is directly connected to the conductive pad which is located right above the first through hole.

18. The manufacturing method as claimed in claim 10, wherein in step of forming the conductive trace, the conductive trace comprises a connecting portion and an extending portion connected to the connecting portion, the connecting portion is directly connected to the conductive pad, and the connecting portion and the conductive pad overlap up and down.

* * * * *